United States Patent
Ito et al.

(10) Patent No.: US 10,391,417 B2
(45) Date of Patent: Aug. 27, 2019

(54) LIQUID MATERIAL VAPORIZATON APPARATUS

(71) Applicant: HORIBA STEC, Co., Ltd., Kyoto-shi, Kyoto (JP)

(72) Inventors: Taketoshi Ito, Kyoto (JP); Masaki Inoue, Kyoto (JP)

(73) Assignee: HORIBA STEC, Co., Ltd., Kyoto-shi, Kyoto (JP)

( * ) Notice: Subject to any disclaimer, the term of this patent is extended or adjusted under 35 U.S.C. 154(b) by 168 days.

(21) Appl. No.: 15/372,231

(22) Filed: Dec. 7, 2016

(65) Prior Publication Data
US 2017/0165620 A1     Jun. 15, 2017

(30) Foreign Application Priority Data
Dec. 11, 2015    (JP) ................. 2015-241703

(51) Int. Cl.
| | |
|---|---|
| *B01B 1/00* | (2006.01) |
| *B01D 1/02* | (2006.01) |
| *B01D 1/14* | (2006.01) |
| *B01F 3/22* | (2006.01) |
| *C23C 16/448* | (2006.01) |

(52) U.S. Cl.
CPC ............ *B01B 1/00* (2013.01); *B01D 1/02* (2013.01); *B01D 1/14* (2013.01); *B01F 3/2246* (2013.01); *B01F 3/2284* (2013.01); *C23C 16/4481* (2013.01)

(58) Field of Classification Search
CPC ........ B01F 3/2246; B01F 3/2284; B01F 1/00; B01D 1/14; B01D 1/02; C23C 16/4481
See application file for complete search history.

(56) References Cited

U.S. PATENT DOCUMENTS 4,249,965 A * 2/1981 Schultz ............... C01B 3/22
                                            148/27
5,324,904 A * 6/1994 Cresswell ........... B01J 19/0013
                                            219/618
(Continued)

FOREIGN PATENT DOCUMENTS

EP       1211333 A2 * 6/2002 ......... C23C 16/4404
EP       3241604 A1 * 11/2017 ......... B01D 19/0031
(Continued)

OTHER PUBLICATIONS

"Flow in Pipes" published Nov. 4, 2004 (Year:2004).*

*Primary Examiner* — Stephen Hobson
(74) *Attorney, Agent, or Firm* — Alleman Hall Creasman & Tuttle LLP

(57) ABSTRACT

In order to eliminate liquid accumulation occurring between a gas-liquid mixing part and a vaporization part to stably perform liquid feeding to the vaporization part and vaporization in the vaporization part, a liquid material vaporization apparatus includes: a gas-liquid mixing part adapted to mix a liquid material and gas to produce a gas-liquid mixture; and a vaporization part adapted to heat the gas-liquid mixture to vaporize the liquid material. In addition, the gas-liquid mixing part has a gas-liquid mixture lead-out pipe for leading out the gas-liquid mixture, the vaporization part has a heating flow path HS for heating the gas-liquid mixture, and a lead-out port of the gas-liquid mixture lead-out pipe is arranged in the heating flow path HS.

7 Claims, 5 Drawing Sheets

(56) References Cited

U.S. PATENT DOCUMENTS

| | | | | |
|---|---|---|---|---|
| 5,372,754 | A * | 12/1994 | Ono | B01F 3/022 |
| | | | | 118/726 |
| 6,039,809 | A * | 3/2000 | Toyama | B01F 3/026 |
| | | | | 118/715 |
| 6,734,405 | B2 * | 5/2004 | Centanni | A61L 2/07 |
| | | | | 219/628 |
| 6,752,387 | B1 * | 6/2004 | Nishizato | B01D 3/346 |
| | | | | 118/726 |
| 8,516,678 | B2 * | 8/2013 | Hennemann | F16L 37/088 |
| | | | | 285/319 |
| 8,763,928 | B2 * | 7/2014 | Nishikawa | B01B 1/005 |
| | | | | 239/135 |
| 9,664,414 | B2 * | 5/2017 | Reichl | A47J 31/542 |
| 10,066,295 | B2 * | 9/2018 | Lee | C23C 14/228 |
| 2005/0095168 | A1 * | 5/2005 | Centanni | A61L 2/07 |
| | | | | 422/3 |
| 2005/0147749 | A1 * | 7/2005 | Liu | B01B 1/005 |
| | | | | 427/248.1 |
| 2010/0108153 | A1 * | 5/2010 | Minami | G05D 11/139 |
| | | | | 137/88 |
| 2010/0186673 | A1 * | 7/2010 | Tanaka | B23K 20/08 |
| | | | | 118/726 |
| 2015/0209738 | A1 * | 7/2015 | Kommareddi | B01F 3/1271 |
| | | | | 366/145 |
| 2016/0222508 | A1 * | 8/2016 | Schoepp | F22B 1/282 |

FOREIGN PATENT DOCUMENTS

| | | | | |
|---|---|---|---|---|
| JP | 2001156055 A | | 6/2001 | |
| WO | WO-03079422 A1 * | | 9/2003 | ......... C23C 16/4481 |
| WO | WO-2005031831 A1 * | | 4/2005 | ......... C23C 16/4481 |
| WO | WO-2007114474 A1 * | | 10/2007 | ......... C23C 16/4481 |
| WO | WO-2010038515 A1 * | | 4/2010 | ......... C23C 16/4481 |

* cited by examiner

LIQUID MATERIAL VAPORIZATON APPARATUS

TECHNICAL FIELD

The present invention relates to a liquid material vaporization apparatus.

BACKGROUND ART

As a conventional liquid material vaporization apparatus, as disclosed in Patent Literature 1, there has been considered an apparatus adapted to mix a liquid material and carrier gas in a gas-liquid mixing part inside a control valve having a liquid flow rate control function while performing flow rate control, and discharge the resulting gas-liquid mixture from a nozzle part formed near a flow rate control part to depressurize and vaporize the liquid material.

CITATION LIST

Patent Literature

Patent Literature 1: Japanese Unexamined Patent Publication JP-A 2001-156055

SUMMARY OF INVENTION

Technical Problem

Also, the liquid material vaporization apparatus of this type cannot easily produce a large flow rate of material gas, and therefore in particular, when requiring a large flow rate, the combined use with a vaporizer has been considered.

Unfortunately, a flow path expands just after the nozzle part of the liquid-gas mixing part, and therefore before entering the vaporizer, flow velocity is reduced, thus causing the accumulation of the liquid material. Also, it is necessary to connect the liquid material vaporization apparatus and the vaporizer by welding, through a pipe joint, or by other means. It is difficult to provide the connecting part between them with a structure for giving thermal energy enough to vaporize the liquid material.

As described, since the flow velocity is reduced just after the nozzle part, and also giving the thermal energy is difficult, the liquid material is accumulated in the connecting part before entering the vaporizer. This prevents liquid feeding to the vaporizer and vaporization in the vaporizer from being stably performed, and as a result, there occurs the problem of difficulty to stably produce the material gas.

Therefore, the present invention is made in order to solve the above problem, and the principal object thereof is to, as much as possible, eliminate liquid accumulation occurring between a gas-liquid mixing part and a vaporization part, and stably perform liquid feeding to the vaporization part and vaporization in the vaporization part.

Solution to Problem

That is, a liquid material vaporization apparatus according to the present invention includes: a gas-liquid mixing part adapted to mix a liquid material and gas to produce a gas-liquid mixture; and a vaporization part adapted to heat the gas-liquid mixture to vaporize the liquid material. In addition, the gas-liquid mixing part has a gas-liquid mixture lead-out pipe for leading out the gas-liquid mixture; the vaporization part has a heating flow path for heating the gas-liquid mixture; and a lead-out port of the gas-liquid mixture lead-out pipe is arranged in the heating flow path.

Since the lead-out port of the gas-liquid mixture lead-out pipe is arranged in the heating flow path, the liquid material vaporization apparatus can directly supply the gas-liquid mixture produced in the gas-liquid mixing part to the heating flow path, and therefore liquid accumulation occurring between the gas-liquid mixing part and the vaporization part can be eliminated as much as possible. This makes it possible to stably perform liquid feeding to the vaporization part and the vaporization in the vaporization part, and thereby material gas can be stably produced.

It is desirable that the heating flow path is formed inside a heating block incorporating a heater.

This configuration allows the lead-out port of the gas-liquid mixture lead-out pipe to be arranged inside the heating block, and therefore the gas-liquid mixture led out of the lead-out port of the gas-liquid mixture lead-out pipe can be surely heated.

It is desirable that the vaporization part has a first connecting part that communicatively connects to the heating flow path and extends outward of the heating block; the gas-liquid mixture lead-out pipe has a second connecting part that is provided around an outer circumferential part on a side opposite to the lead-out port and connected to the first connecting part; and the first connecting part and the second connecting part are connected to each other in a state where the lead-out port of the gas-liquid mixture lead-out pipe is arranged in the heating flow path.

Since this configuration allows the second connecting part provided around the outer circumferential part of the gas-liquid mixture lead-out pipe to be connected to the first connecting part extending outward of the heating block, heat transfer from the heating block to the gas-liquid mixing part can be reduced to suppress the vaporization of the liquid material in the gas-liquid mixing part. Note that once the liquid material is vaporized in the gas-liquid mixing part, an amount of supplying the liquid material to the vaporization part is varied, and thereby stable vaporization in the vaporization part is blocked.

It is desirable that an internal flow path of the gas-liquid mixture lead-out pipe is of a uniform cross-sectional shape throughout.

Since in this configuration, there is no nozzle structure inside the gas-liquid mixture lead-out pipe, the accumulation of the gas-liquid mixture just after a nozzle structure can be eliminated, and therefore liquid accumulation of the gas-liquid mixture can be further eliminated. Note that the heating flow path is larger in flow path cross section than the internal flow path of the gas-liquid mixture lead-out pipe, and therefore the flow velocity of the gas-liquid mixture is reduced after the gas-liquid mixture has flowed out to the heating flow path; however, at the time when flowing out to the heating flow path, the liquid material is heated, and therefore the reduction in flow velocity is not matter. Also, since no nozzle structure is provided inside the gas-liquid lead-out pipe, a nozzle structure can also be prevented from being clogged with air bubbles. Further, the configuration of the gas-liquid mixture lead-out pipe can be simplified.

Advantageous Effects of Invention

According to the present invention configured as described above, since the lead-out port of the gas-liquid mixture lead-out pipe is arranged in the heating flow path, liquid accumulation occurring between the gas-liquid mixing part and the vaporization part can be eliminated as much as possible, and therefore liquid feeding to the vaporization part and the vaporization in the vaporization part can be stably performed.

DESCRIPTION OF EMBODIMENTS

In the following, one embodiment of a liquid material vaporization apparatus according to the present invention will be described with reference to the drawings.

A liquid material vaporization apparatus 100 of the present embodiment is one that is incorporated in, for example, an optical fiber manufacturing apparatus and used for an optical fiber manufacturing process. Alternatively, the liquid material vaporization apparatus 100 may be adapted to be incorporated in, for example, a semiconductor manufacturing apparatus and used for a semiconductor manufacturing process.

Figure 1:
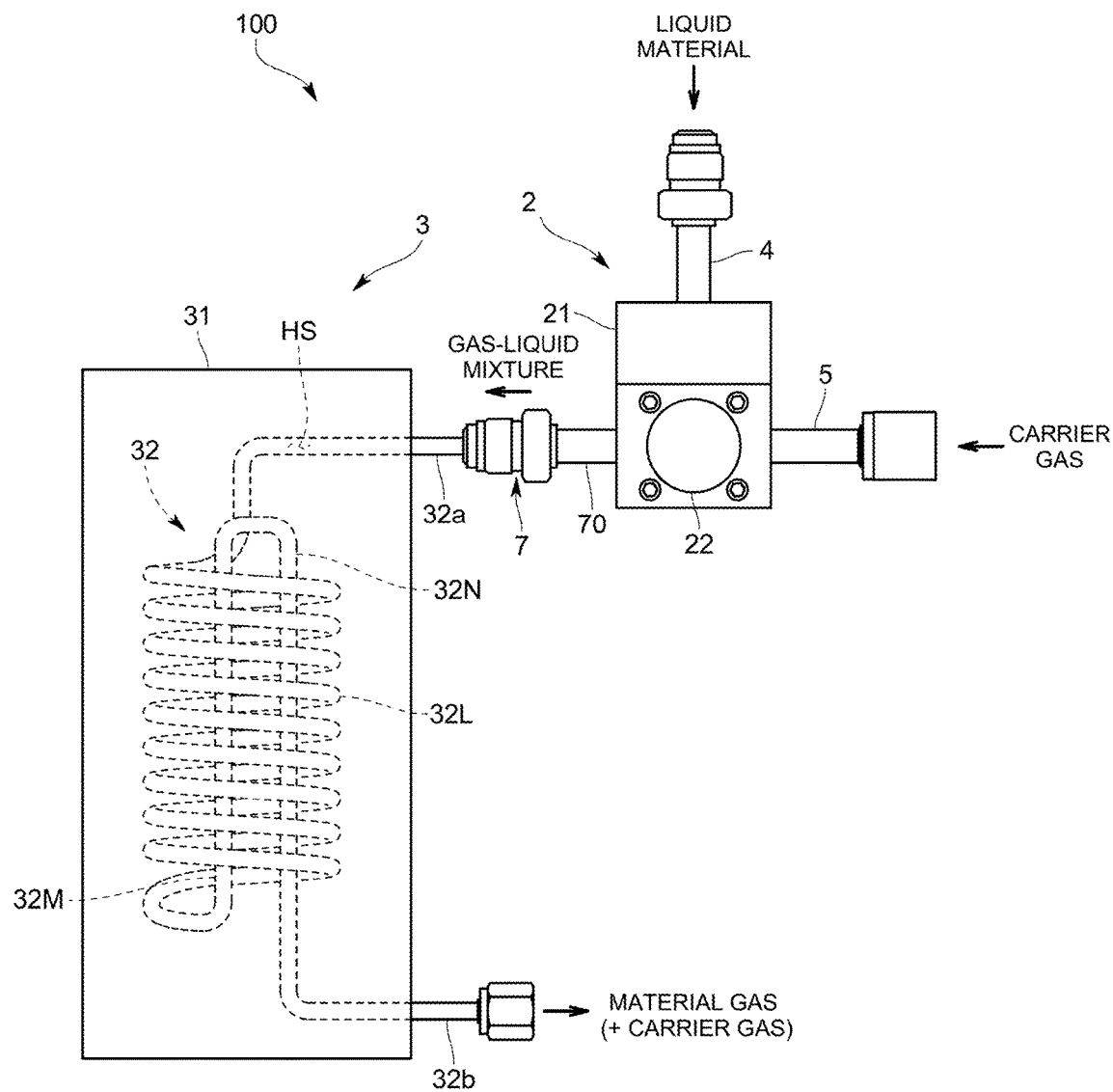
FIG. 1 is a schematic diagram illustrating a configuration of a liquid material vaporization apparatus in the present embodiment.

Specifically, as illustrated in FIG. 1, the liquid material vaporization apparatus 100 includes: a gas-liquid mixing part 2 adapted to mix a liquid material and carrier gas as gas to produce a gas-liquid mixture; and a vaporization part 3 adapted to heat the gas-liquid mixture, and lead out material gas, which results from the vaporization of the liquid material, with the carrier gas.

In addition, the liquid material is OMCTS (octamethyl-cyclotetrasiloxane, a boiling point of 175° C.), TEOS (tetraethoxysilane, a boiling point of 169° C.), or the like. Alternatively, the liquid material may be, for example, a halogen-based liquid material such as $SiCl_4$ used for conventional optical fiber manufacturing, or a material used for a semiconductor manufacturing process.

Figure 2:
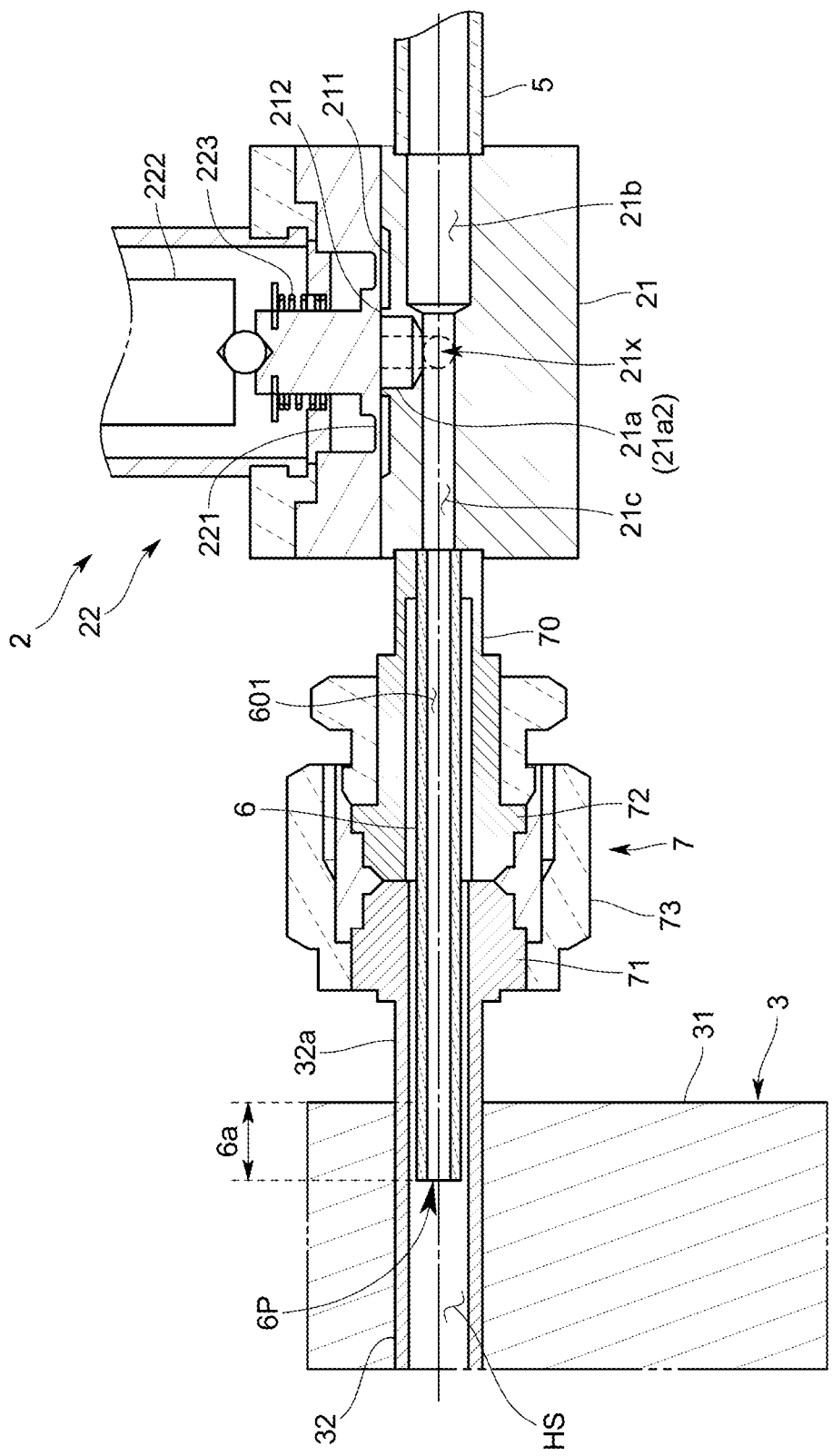
FIG. 2 is a cross-sectional view illustrating the internal structure of a gas-liquid mixing part and the connecting structure of the gas-liquid mixing part with a vaporization part in the same embodiment.

As illustrated in FIG. 2, the gas-liquid mixing part 2 includes: a main block 21 having a mixing part 21x in which the liquid material and the carrier gas are mixed; and a valve unit 22 that is provided in the main block 21 to adjust the flow rate of the liquid material.

Figure 3:
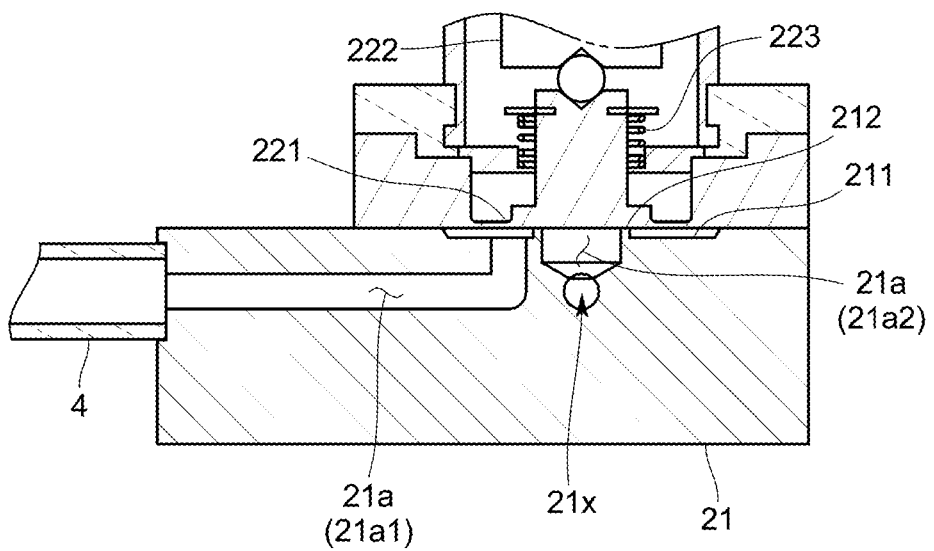
FIG. 3 is a cross-sectional view of a main block in the same embodiment.
Figure 4:
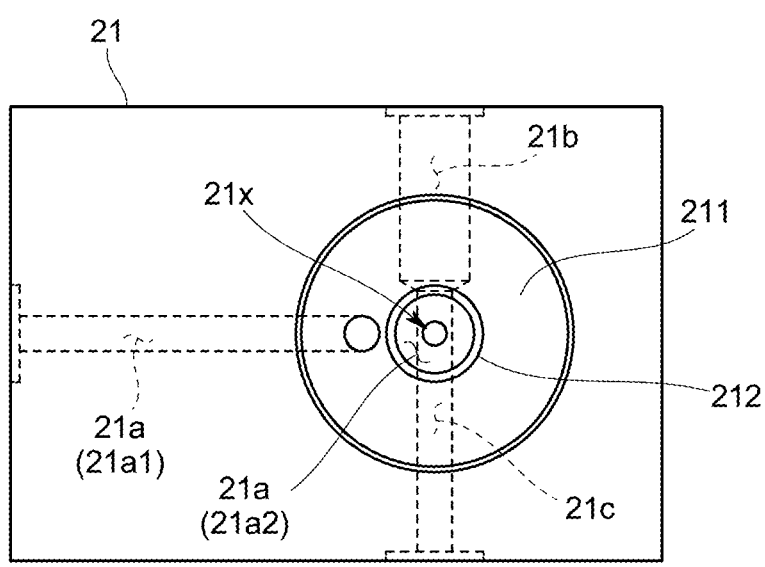
FIG. 4 is a plan view of the main block in the same embodiment.

The main block 21 is one formed of a material having high heat resistance and high corrosion resistance, such as stainless steel. As illustrated in FIGS. 2 to 4, in the main block 21, a liquid material flow path 21a through which the liquid material flows, a carrier gas flow path 21b through which the carrier gas flows, and a gas-liquid mixture flow path 21c through which the gas-liquid mixture flows are formed. In addition, the merging part between the liquid material flow path 21a and the gas-liquid mixture flow path 21c serves as a mixing part 21x for the liquid material and the carrier gas. The mixing part 21x is connected with the gas-liquid mixture flow path 21c. In the present embodiment, the carrier gas flow path 21b and the gas-liquid mixture flow path 21c are coaxially linearly formed through the mixing part 21x. Also, the carrier gas flow path 21b is reduced in diameter just before the mixing part 21x so as to have the same diameter as that of the gas-liquid mixture flow path 21c.

In the present embodiment, the liquid material flow path 21a is configured to be divided into an upstream side part 21a1 and a downstream side part 21a2 by the valve unit 22 (see FIG. 3).

Specifically, in one surface (specifically, the upper surface) of the main block 21 onto which the valve unit 22 is attached, an annular-shaped concave part 211 is formed, and in the bottom surface of the concave part 211, a downstream side opening of the upstream side part 21a1 of the liquid material flow path 21a is formed.

Also, in the central part of the annular-shaped concave part 211, an upstream side opening of the downstream side part 21a2 is formed, and the downstream side part 21a2 is connected to the mixing part 21x. In addition, the downstream side part 21a2 is orthogonal to the carrier gas flow path 21b and the gas-liquid mixture flow path 21c. Note that the peripheral part 212 of the upstream side opening in the central part of the annular-shaped concave part 211 serves as a valve seat (hereinafter referred to as a valve seat 212) that the valve unit 22 contacts with or separates from.

The valve unit 22 is one functioning as a control valve, and as illustrated in FIG. 2, provided on the upper surface of the main block 21 through a seal member (not illustrated).

The valve unit 22 includes: a diaphragm 221 as a valve element part that contacts with or separates from the valve seat 212 formed on the upper surface of the main block 21; and an actuator 222 that presses and deforms the diaphragm 221.

The diaphragm 221 is formed of an appropriately elastic material having high heat resistance and high corrosion resistance. Also, the actuator 222 is one employing a piezo stack formed by stacking multiple piezoelectric elements in a housing.

In addition, in the valve unit 22, the diaphragm 221 is constantly biased upward by a spring 223, and thereby separates from the valve seat 212. Also, when the actuator 222 makes a downward pressing force act, the diaphragm 221 is displaced in a direction to contact with the valve seat 212. Thus, the flow rate of the liquid material can be controlled on the basis of the positional relationship between the diaphragm 221 and the valve seat 212.

Further, as illustrated in drawings such as FIGS. 1 and 2, the main block 21 is connected with: a liquid material supply pipe 4 for supplying the liquid material to the liquid material flow path 21a; a carrier gas supply pipe 5 for supplying the carrier gas to the carrier gas flow path 21b; and a gas-liquid mixture lead-out pipe 6 for leading out the gas-liquid mixture from the gas-liquid mixture flow path 21c. In addition, the supply pipes 4 and 5 and the lead-out pipe 6 are connected to outside surfaces of the main block 21 and provided extending outward of the main block 21.

On the upstream side of the liquid material supply pipe 4, a mass flow meter (not illustrated) adapted to measure the flow rate of the liquid material flowing through the liquid material supply pipe 4 is provided. Further, on the basis of a measured value of the mass flow meter, the valve unit 22 is feedback-controlled such that the liquid material to be supplied to the mixing part 21x has a predetermined flow rate. Also, on the upstream side of the carrier gas supply pipe 5, a mass flow controller adapted to adjust the flow rate of the carrier gas flowing through the carrier gas supply pipe 5 is provided. The mass flow controller is feedback-controlled so as to be set to a predetermined flow rate just enough for the below-described vaporization part 3 to be able to vaporize the liquid material.

The gas-liquid mixture lead-out pipe 6 is one forming a straight pipe shape, of which the inside diameter is smaller than that of the gas-liquid mixture flow path 21c. This allows the flow velocity of the gas-liquid mixture flowing through an internal flow path 601 of the gas-liquid mixture lead-out pipe 6 to become larger than the flow velocity of the gas-liquid mixture flowing through the gas-liquid mixture flow path 21c of the main block 21. Also, the internal flow path 601 of the gas-liquid mixture lead-out pipe 6 is of a uniform cross-sectional shape throughout. This provides a fluid resistance-free structure unlike a nozzle or the like, and in other words, the internal flow path 601 of the gas-liquid mixture lead-out pipe 6 is configured not to change the flow velocity. Accordingly, the gas-liquid mixture having flowed into the gas-liquid mixture lead-out pipe 6 has the flow velocity higher than the flow velocity in the gas-liquid mixture flow path 21c, and is led out to the vaporization part 3 at that flow velocity.

As illustrated in FIGS. 1 and 2, the vaporization part 3 includes a heating block 31 having a heating flow path HS adapted to heat the gas-liquid mixture produced in the gas-liquid mixing part 2.

Specifically, the vaporization part 3 includes a heating pipe 32 forming the heating flow path HS and heaters 33 adapted to heat the heating pipe 32, and is configured to incorporate the heating pipe 32 and the heaters 33 in the heating block 31 by covering the heating pipe 32 and the heaters 33 with metal (aluminum) for heat transfer. In the present embodiment, the heating block 31 is formed by casting aluminum into a mold containing the heating pipe 32 and the heaters 33. Note that FIG. 1 omits illustration of the heaters 33.

Further, the vaporization part 3 is configured such that one end part 32a and the other end part 32b of the heating pipe 32 extend outward from an outer surface of the heating block 31. In addition, the one end part 32a of the heating pipe 32 is connected to the gas-liquid mixing part 2, whereas the other end part 32b of the heating pipe 32 serves as a lead-out port for leading out vaporized gas resulting from the vaporization of the liquid material. Note that an internal flow path that is part of the heating pipe 32 positioned on an inner side than the outer surfaces of the heating block 31 serves as the heating flow path HS.

The heating pipe 32 in the present embodiment is such that as illustrated in FIG. 1, the one end part 32a thereof is provided on the upper end side of the heating block 31, and the other end part 32b thereof is provided on the lower end side of the heating block 31. In addition, the heating pipe 32 has, inside the heating block 31: a spiral part 32L that is spirally wound downward from the one end part 32a; a first linear part 32M that bends upward at the lower end part of the spiral part and linearly extends to an upper end part; and a second linear part 32N that bends downward again at the upper end part of the first linear part 32M and linearly extends to a lower end part to connect to the other end part 32b. Since the heating pipe 32 has a flow path extending upward from below like the first linear part 32M, the liquid can be prevented from being discharged from the other end part 32b as the lead-out port.

Figure 5:
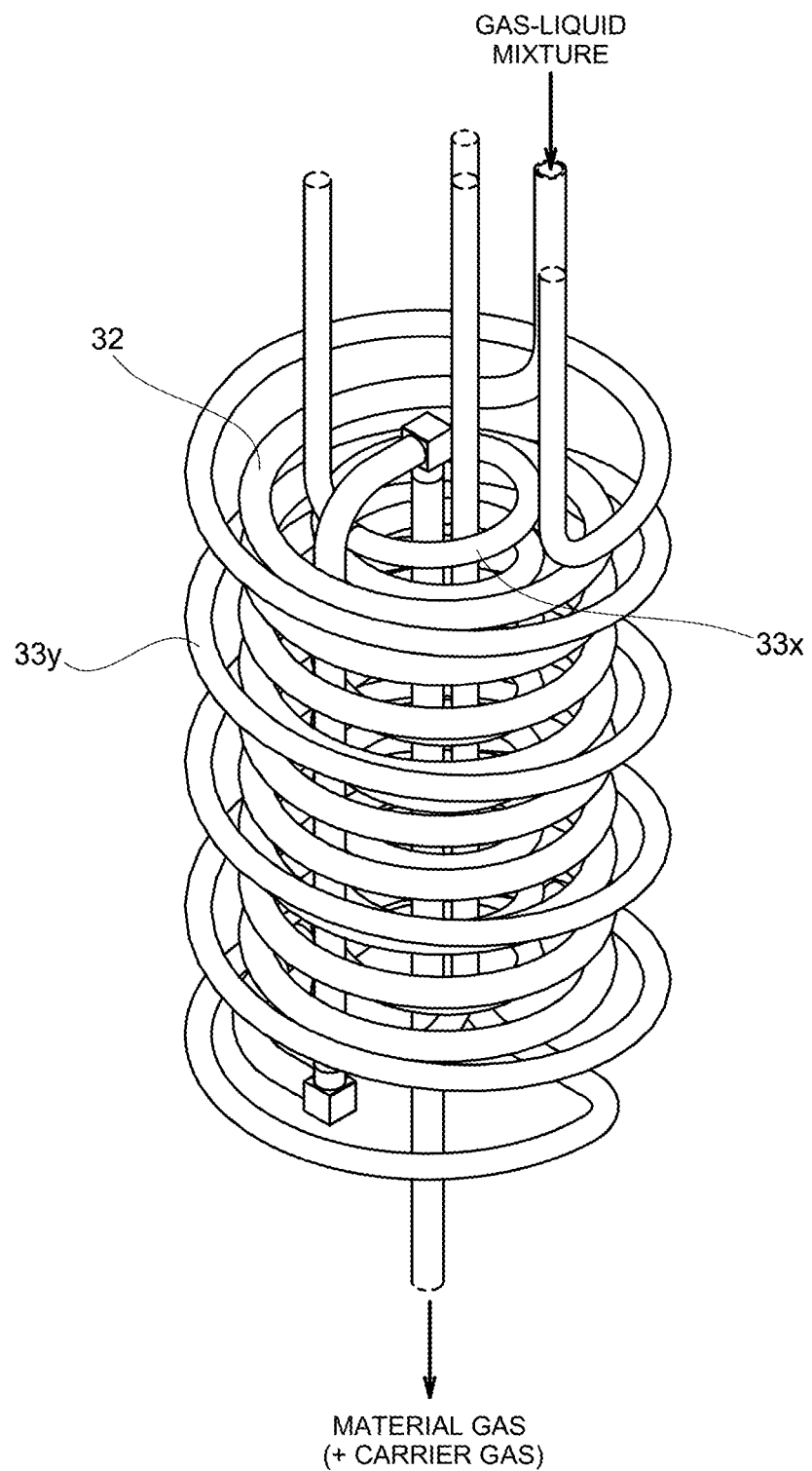
FIG. 5 is a perspective view illustrating the configuration of the vaporization part excluding a heating block in the same embodiment.

Also, as illustrated in FIG. 5, the heaters 33 are respectively provided on the inner and outer sides of the spiral part 32L of the heating pipe 32 inside the heating block 31. Note that FIG. 5 illustrates an internal configuration excluding the heating block 31. In the present embodiment, the inner heater 33x and the outer heater 33y are both provided spirally wound along the spiral part 32L of the heating pipe 32. By providing the heaters 33 not only on the inner side (the inner heater 33x) of the spiral part but on the outer side (the outer heater 33y), the heating pipe 32 can be efficiently heated while preventing heat radiation from the outer peripheral surfaces of the heating block 31.

Further, as illustrated in FIG. 2, in the liquid material vaporization apparatus 100 of the present embodiment, a lead-out port 6P of the gas-liquid mixture lead-out pipe 6 is arranged in the heating flow path HS of the heating block 31.

Specifically, the gas-liquid mixture lead-out pipe 6 is inserted so as to position a part thereof having a predetermined length from the lead-out port 6P (a fore end part 6a) in the heating flow path HS. That is, the fore end part 6a of the gas-liquid mixture lead-out pipe 6 is in a state of being inserted on an inner side than the outer surface of the heating block 31 in the heating pipe 32. This configuration allows the fore end part 6a of the gas-liquid mixture lead-out pipe 6 to be arranged in a flow path part directly receiving heat of the heaters 33 from the heating block 31.

Also, the gas-liquid mixture lead-out pipe 6 is arranged coaxially with the one end part 32a of the heating pipe 32 and a predetermined area connecting to the one end part 32a. In addition, the one end part 32a of the heating pipe 32 and the predetermined area form a straight pipe shape. Note that the predetermined area corresponds to a range where at least the fore end part 6a is inserted.

Further, the flow path cross-sectional shape of the straight pipe part of the heating pipe 32 is larger than the cross-sectional outline shape of the fore end part 6a of the gas-liquid mixture lead-out pipe 6. In the present embodiment, the inside diameter of the straight pipe part of the heating pipe 32 is larger than the outside diameter of the fore end part 6a of the gas-liquid mixture lead-out pipe 6. This allows the fore end part 6a of the gas-liquid mixture lead-out pipe 6 to be arranged keeping a gap with the heating pipe 32 without contact with the heating pipe 32. As described, the fore end part 6a of the gas-liquid mixture lead-out pipe 6 and the heating pipe 32 do not contact with each other, and thereby heat transfer from the heating pipe 32 to the gas-liquid mixture lead-out pipe 6 is decreased. As a result of decreasing the heat transfer to the gas-liquid mixture lead-out pipe 6, the vaporization of the liquid material in the gas-liquid mixture lead-out pipe 6 can be prevented, and thereby the gas-liquid mixture lead-out pipe 6 can be prevented from being clogged with impurities contained in the liquid material. Also, by preventing the vaporization of the liquid material in the gas-liquid mixture lead-out pipe 6, a pressure rise in the gas-liquid mixture lead-out pipe 6 can be suppressed, and flow rate control can be accurately performed.

Next, a connecting structure 7 between the gas-liquid mixing part 2 and the vaporization part 3 will be described with reference to FIG. 2.

The connecting structure 7 in the present embodiment has: a first connecting part 71 that is provided on the one end part 32a side of the heating pipe 32 of the vaporization part 3; and a second connecting part 72 that is provided around the outer circumferential part of the gas-liquid mixture lead-out pipe 6 on the side opposite to the lead-out port 6P and connected to the first connecting part 71.

The second connecting part 72 is connected to the main block 21 of the gas-liquid mixing part 2 and also formed in the fore end part of a connecting pipe 70 coaxially arranged outside the gas-liquid mixture lead-out pipe 6.

Further, the first connecting part 71 and the second connecting part 72 are connected to each other by a pipe joint 73 such as a VCR joint in a state where the fore end part 6a including the lead-out port 6P of the gas-liquid mixture lead-out pipe 6 is arranged in the heating flow path HS. In addition, in this state, the outer circumferential surface of the gas-liquid mixture lead-out pipe 6 is formed with a cylindrical gap with the connecting pipe 70 and the heating pipe 32 except for a base end part (a connecting part with the connecting pipe 70) of the gas-liquid mixture lead-out pipe 6. That is, the gas-liquid mixture lead-out pipe 6, and the heating pipe 32 and the connecting pipe 70 form a double pipe structure.

The connecting structure 7 using the pipe joint 73 allows the gas-liquid mixing part 2 and the vaporization part 3 to be separated from each other, and various combinations of the gas-liquid mixing part 2 and the vaporization part 3 can be made.

Also, since the gap is formed between the gas-liquid mixture lead-out pipe 6, and the heating pipe 32 and the connecting pipe 70 is formed, when the connecting structure 7 connects the both, a variation (error) in position due to the machining or attachment accuracy of the gas-liquid mixture lead-out pipe 6 can be accommodated to insert the gas-liquid mixture lead-out pipe 6 into the heating pipe 32. Further, since the gap is formed between the gas-liquid mixture lead-out pipe 6 and the connecting pipe 70, the machining accuracy of the inner surface of the second connecting part 72 provided in the fore end part of the connecting pipe 70 does not also become problematic.

Note that in the space between the gas-liquid mixture lead-out pipe 6 and the connecting pipe 70 (and the heating pipe 32), a substance resulting from cooling and liquefying the gas-liquid mixture or the vaporized liquid material (material gas) may be accumulated. For this reason, it is conceivable to provide the connecting pipe 70 with a port for introducing or leading out gas (e.g., the carrier gas), introduce the gas through the port, and flow the gas toward the vaporization part 3 side. Alternatively, it may be adapted to lead out the gas-liquid mixture or the gas through the port. This process may be performed during the stop period of liquid material vaporization operation or after the end of the vaporization operation. Alternatively, the process may be performed during the vaporization operation.

In the liquid material vaporization apparatus 100 configured as described above, since the lead-out port 6P of the gas-liquid mixture lead-out pipe 6 is arranged in the heating flow path HS, the gas-liquid mixture produced in the gas-liquid mixing part 2 can be directly supplied to the heating flow path HS, and liquid accumulation occurring between the gas-liquid mixing part 2 and the vaporization part 3 can be eliminated as much as possible. This makes it possible to stably perform the liquid feeding to the vaporization part 3 and the vaporization in the vaporization part 3 to stably produce the material gas. In particular, the liquid material vaporization apparatus 100 of the present invention can stably supply a large flow rate of material gas even in a system using a large amount of liquid material per unit time (e.g., 10 to 200 g/min).

Note that the present invention is not limited to the above embodiment.

It goes without saying that the liquid material vaporization apparatus of the above embodiment can be used not only for an optical fiber manufacturing process or a semiconductor manufacturing process but for the other general application adapted to vaporize a liquid material.

Also, a nozzle may be provided at the fore end part 6a of the gas-liquid mixture lead-out pipe 6 in the above embodiment. By forming a structure having the nozzle at the fore end part 6a as described but not having any nozzle in the gas-liquid mixture lead-out pipe 6 to the vaporization part 3, a pressure drop to the vaporization part 3 can be made as small as possible to keep a reduction in flow velocity as low as possible.

Further, the gas-liquid mixing part 2 in the above embodiment is one such that the valve unit 22 controls the flow rate of the liquid material, but may be configured to form an opening in the bottom surface of the concave part 211 of the main block 21 for the carrier gas flow path 21b and control the flow rate of the carrier gas in addition to the flow rate of the liquid material. Besides, as the type of the gas-liquid mixing part, a type adapted to spray the liquid material into the gas using a nozzle or the like, or a type adapted to vibrate the liquid with an ultrasonic wave using an ultrasonic transducer or the like is also possible.

In addition, the above embodiment is adapted to make the pipe connection between the gas-liquid mixing part 2 and the vaporization part 3 using the first and second connecting parts, but may be adapted to connect the main block 21 of the gas-liquid mixing part 2 and the heating block 31 of the vaporization part 3 directly or through an intermediate block.

Still in addition, the vaporization part 3 is configured by casting aluminum in a mold containing the heating pipe 32 and the heaters, but besides may be configured to form the heating flow path HS by machining an aluminum block body as well as forming heater insertion holes to insert the heaters 33 into the heater insertion holes. Further, it may be configured to provide a heater around the heating pipe 32 by means such as winding the heater on the outer circumferential surface of the heating pipe 32, and heat the heating pipe 32. Even in this case, a part of the heating pipe 32 heated by the heater serves as the heating flow path.

In the above embodiment, the gas-liquid mixture lead-out pipe 6 is of a straight pipe shape but may be a curved one or a bent one depending on the arrangement of the gas-liquid mixing part 2 and the vaporization part 3.

The gas-liquid mixture lead-out pipe 6 in the above embodiment may be formed integrally with the main block 21. In this case, the gas-liquid mixture flow path 21c of the main block 21 constitutes part of the gas-liquid mixture lead-out pipe 6. That is, the downstream side of the mixing part 21x in the gas-liquid mixing part 2 may be made to serve as the part of the gas-liquid mixture introduction pipe 6.

The liquid material in the above embodiment may be, in addition to the one in the above embodiment, one prepare by dissolving a solid in a solvent, or one prepared by dispersing solids in a dispersion medium.

The vaporization part in the above embodiment can also be configured as a heat exchanger by itself. Also, the inner and outer heaters incorporated in the vaporization part are not limited to the spiral ones, but may take various shapes such as a rod-like shape and a meandering shape. Further, multiple heaters may be provided on each of the inner and outer sides of the heating pipe.

Besides, it should be appreciated that the present invention is not limited to any of the above embodiments, but can be variously modified without departing from the scope thereof.

LIST OF REFERENCE CHARACTERS

100: Liquid material vaporization apparatus
2: Gas-liquid mixing part
3: Vaporization part
31: Heating block
HS: Heating flow path
33 (33x): Heater (inner heater)
33 (33y): Heater (outer heater)
6: Gas-liquid mixture lead-out pipe
6P: Lead-out port of gas-liquid mixture lead-out pipe
71: First connecting part
72: Second connecting part

The invention claimed is:

1. A liquid material vaporization apparatus comprising:
   a gas-liquid mixing part adapted to mix a liquid material and gas to produce a gas-liquid mixture; and
   a vaporization part adapted to heat the gas-liquid mixture to vaporize the liquid material, wherein:
      the gas-liquid mixing part has a gas-liquid mixture lead-out pipe for leading out the gas-liquid mixture;
      the vaporization part has a heating pipe forming a heating flow path for heating the gas-liquid mixture;
      a lead-out port of the gas-liquid mixture lead-out pipe is arranged in the heating flow path, and a fore end part of the gas-liquid mixture lead-out pipe forms a double pipe with the heating pipe such that an outer lateral surface of the gas-liquid mixture lead out pipe is separate from an inner lateral surface of the heating pipe; and
      the gas-liquid mixture lead-out pipe has:
         a uniform diameter along its length, or a nozzle at the fore end part of the gas-liquid mixture lead out pipe.

2. The liquid material vaporization apparatus according to claim 1, wherein
   the heating flow path is formed inside a heating block incorporating a heater.

3. The liquid material vaporization apparatus according to claim 2, wherein:
   the vaporization part has a first connecting part that communicatively connects to the heating flow path and extends outward of the heating block;
   the gas-liquid mixture lead-out pipe has a second connecting part that is provided around an outer circumferential part on a side opposite to the lead-out port and connected to the first connecting part; and
   the first connecting part and the second connecting part are connected to each other in a state where the lead-out port of the gas-liquid mixture lead-out pipe is arranged in the heating flow path.

4. The liquid material vaporization apparatus according to claim 1, wherein
   an internal flow path of the gas-liquid mixture lead-out pipe is of a uniform cross-sectional shape throughout.

5. The liquid material vaporization apparatus according to claim 1, wherein
   the vaporization part has a heating block that is configured to incorporate the heating pipe such that one end part of the heating pipe extends outward, and
   the gas-liquid mixture lead-out pipe is separate from the inner lateral surface of the one end part of the heating pipe.

6. The liquid material vaporization apparatus according to claim 1, wherein
   the gas-liquid mixture lead-out pipe is inserted inside of the heating pipe.

7. The liquid material vaporization apparatus according to claim 1, wherein
   the gas-liquid mixture lead-out pipe and the heating pipe are configured to be separable such that the gas-liquid mixing part and the vaporization part are allowed to be separated from each other.

* * * * *